United States Patent
Sevastopoulos et al.

(10) Patent No.: US 6,344,773 B1
(45) Date of Patent: Feb. 5, 2002

(54) FLEXIBLE MONOLITHIC CONTINUOUS-TIME ANALOG LOW-PASS FILTER WITH MINIMAL CIRCUITRY

(75) Inventors: Nello G. Sevastopoulos, Saratoga; Doug A. LaPorte, San Jose, both of CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/693,058

(22) Filed: Oct. 20, 2000

(51) Int. Cl.[7] .................................. H03B 1/00
(52) U.S. Cl. ........................ 327/558; 327/552
(58) Field of Search ...................... 327/552, 553, 327/554, 555, 556, 557, 558, 344; 330/260, 261, 278, 279, 280, 281, 282, 284, 285, 291, 293, 294

(56) References Cited

U.S. PATENT DOCUMENTS

| | | | |
|---|---|---|---|
| 3,805,178 A | * 4/1974 | Rollett | 327/552 |
| 4,257,006 A | 3/1981 | Schaumann | 327/552 |
| 4,303,889 A | 12/1981 | Yokoyama et al. | 330/109 |
| 4,335,359 A | 6/1982 | Kriedt et al. | 330/107 |
| 4,417,214 A | 11/1983 | Sevastopoulos et al. | 330/107 |
| 4,593,250 A | 6/1986 | Lucas et al. | 330/107 |
| 4,783,635 A | 11/1988 | Sevastopoulos et al. | 330/107 |
| 4,857,860 A | 8/1989 | Sevastopoulos et al. | 330/107 |
| 4,868,516 A | * 9/1989 | Henderson et al. | 330/86 |
| 4,988,952 A | 1/1991 | Sevastopoulos et al. | 330/51 |
| 5,440,270 A | 8/1995 | Sevastopoulos et al. | 330/107 |
| 6,121,908 A | 9/2000 | Sevastopoulos et al. | 341/139 |

OTHER PUBLICATIONS

"Active RC, 4th Order Lowpass Filter Family," LTC1563–2/LTC1563–3 Data Sheet, 2000.

Kerry Lacanette, *A Basic Introduction to Filters–Active, Passive, and Switched–Capacitor*, National Semiconductor Application Note 779, Apr. 1991.

Thomas M. Frederiksen, *Intuitive IC Op Amps*, pp. 246–247, National Semiconductor Technology Series, R. R. Donnelley and Sons, 1984.

M. E. Van Valkenburg, *Analog Filter Design*, Chapter 18: Delay Equalization, published by Halt, Rinehart & Winston, New York, 1982.

Aram Budak, *Passive and Active Network Analysis and Synthesis*, pp. 448–455, 644–651, published by Houghton, Mifflin Co., Boston, 1974.

* cited by examiner

*Primary Examiner*—Kenneth B. Wells
*Assistant Examiner*—Paul Dinh
(74) *Attorney, Agent, or Firm*—Fish & Neave; Mark D. Rowland; Michael J. DeHaemer, Jr.

(57) ABSTRACT

A completely tunable second order low-pass filter with minimal active circuitry is disclosed. The filter provides a very flexible choice of filter parameters such as cutoff frequency, DC gain, and Q factor, by selecting appropriate resistor values for a single integrated circuit with much lower capacitance, capacitance ratio, and active circuitry than other standard low-pass circuit configurations.

15 Claims, 4 Drawing Sheets

FLEXIBLE MONOLITHIC CONTINUOUS-TIME ANALOG LOW-PASS FILTER WITH MINIMAL CIRCUITRY

FIELD OF THE INVENTION

The present invention relates generally to integrated circuit continuous-time analog filters. More specifically, the present invention provides a completely tunable second order low-pass filter with minimal active circuitry.

BACKGROUND OF THE INVENTION

Analog filters are essential to the operation of most electronic circuits and are often used to separate signals from noise. In general, an analog filter is an electrical network that alters the amplitude and/or phase characteristics of a signal with respect to frequency to freely transmit the signal within one or more frequency bands and to attenuate signals of other frequencies.

There are five basic filter types according to the frequency bands: all-pass, bandpass, notch, low-pass, and high-pass. An all-pass filter has no effect on the amplitude of the signal at different frequencies and its function is to simply change the phase of the signal without affecting its amplitude. The other four filter types freely transmit or pass signals falling within a relatively narrow band of frequencies and attenuate signals outside of that band. The range of frequencies passed by a filter is known as the filter's passband, and the range of frequencies over which unwanted signals are attenuated is known as the filter's stopband. A bandpass filter has two stopbands, one above and one below the passband, while a notch filter has effectively the opposite function, with two passbands, one above and one below the stopband. The low-pass and high-pass filters have one passband and one stopband each, with the low-pass filter passing all low frequency signals up to some specified frequency, known as the cutoff frequency, and attenuating high frequency signals, and the high-pass filter rejecting low frequency signals below the cutoff frequency and passing all high frequency signals above that frequency.

Low-pass filters are widely employed in many diverse applications, whenever high frequency components must be removed from a signal. Examples usually involve some form of noise suppression, such as in broadband communications, audio systems, and satellite imagery. Low-pass filter designs are in general used as the basis of other filter designs, and high-pass or band-pass filters are often simply transformations from low-pass filter designs.

An ideal low-pass filter design would exhibit a perfectly flat response in its passband and infinite attenuation in its stopband, with a rapid transition from passband to stopband. In practice, however, the ideal low-pass filter can only be approximated. Achieving a desired filter performance often involves careful selection and tuning of filter components. The amplitude response characteristics can be improved by increasing the order of the filter, which is directly related to the number of components in the filter, and therefore to its cost, its physical size, and the design complexity. The primary advantage of a higher-order filter is that it has a steeper transition from passband to stopband than a similar lower-order filter. In general, second order filters are considered the simplest, and can be easily cascaded to form higher order filters. Another parameter used to describe the performance of a filter is the filter's "Q", or Q factor. The Q factor indicates the sharpness of the amplitude response in the region near the cutoff frequency and the width of the frequency band around that frequency. When the Q is high, the amplitude response is sharply focused around a peak corresponding to the cutoff frequency (narrow width), and when the Q is low, the amplitude response is flat and tapers off slowly to the stopband. A Q value of 0.707 results in a maximally flat response. Low-pass filters are typically designed to satisfy a given cutoff frequency and to achieve a desired Q, cost, and complexity.

Conventional analog low-pass filter implementations comprise networks of resistors, capacitors, and inductors. These filters are usually referred to as passive filters for their lack of amplifying elements, which means the filters cannot provide signal gain. In addition, these filters can be complex, time-consuming, and expensive to design due to the difficulty in tuning the inductors to provide the accuracy desired.

The recent availability of integrated circuit (IC) operational amplifiers (op-amps) has made it possible to design low-pass filters without inductors, thereby reducing the problems associated with those components. These filters are referred to as active filters, for their use of amplifying elements, and are usually easier to design than passive filters. In addition, active filters can achieve any arbitrary gain.

There are several known active filter configurations for designing low-pass filters. One of the most widely used is the signal inverting multiple feedback (MFB) circuit for designing a second order low-pass filter. The MFB circuit uses one op-amp and two capacitors to achieve a second order filter and is simple to design. However, as an integrated circuit, the MFB $2^{nd}$ nd order low-pass filter is very limited, and has several drawbacks.

First, the achievable DC gain and Q factor are very constrained, and can be increased from the initial design by only about 25% once the op-amp and capacitors are integrated. This results in difficult tunability of filter components for flexibility of cutoff frequency, DC gain, and Q factor. Second, the ratio of capacitor values to achieve a certain Q factor for Q>1, may be quite large, making it difficult to match the capacitors for a good degree of accuracy. And lastly, the total capacitance required by the MFB circuit is fairly high, which results in a higher manufacturing cost as well as in a larger die area.

In view of the foregoing drawbacks of designing a second order MFB low-pass filter, it would be desirable to provide a completely tunable second order low-pass filter with minimal active circuitry.

It would further be desirable to provide a second order low-pass filter with a lower capacitance and capacitance ratio than the second order MFB low-pass filter.

It would still further be desirable to provide a second order low-pass filter in which the filter parameters are defined by three resistors and the area devoted to active circuitry is much smaller than in other fully programmable low-pass circuit configurations.

It would also be desirable to provide a second order low-pass filter that may be easily cascaded to form higher order filters.

SUMMARY OF THE INVENTION

In view of the foregoing, it is an object of the present invention to provide a completely tunable second order low-pass filter with minimal active circuitry.

It is another object of the present invention to provide a second order low-pass filter with a lower capacitance and capacitance ratio than the second order MFB low-pass filter.

It is a further object of the present invention to provide a second order low-pass filter in which the filter parameters are defined by three resistors and the area devoted to active circuitry is much smaller than in other fully programmable low-pass circuit configurations.

It is also an object of the present invention to provide a second order low-pass filter that may be easily cascaded to form higher order filters.

These and other objects of the present invention are accomplished by providing a completely tunable second order low-pass filter with minimal active circuitry. The filter design enables a very flexible choice of filter parameters such as cutoff frequency, DC gain, and Q factor, by selecting appropriate resistor values for a single integrated circuit.

In a preferred embodiment, the present invention involves inserting a positive feedback loop in the second order MFB low-pass filter circuit configuration. The positive feedback loop is preferably realized with an inverting gain amplifier incorporated into the active circuitry. With the positive feedback, the integrated circuit becomes a fully programmable second order low-pass filter building block that provides a very flexible choice of filter parameters.

Advantageously, the present invention requires much lower capacitance and capacitance ratio than the MFB low-pass circuit, and much smaller active circuitry area than other fully programmable low-pass circuit configurations, including the Tow-Thomas and state variable filters.

In addition, the present invention enables the second order filter to be easily cascaded to form higher order filters.

BRIEF DESCRIPTION OF THE DRAWINGS

The foregoing and other objects of the present invention will be apparent upon consideration of the following detailed description, taken in conjunction with the accompanying drawings, in which like reference characters refer to like parts throughout, and in which.

DETAILED DESCRIPTION OF THE INVENTION

The present invention provides a completely tunable second order low-pass filter with minimal active circuitry that can be easily cascaded to form higher order filters. The second order low-pass filter is preferably constructed from the second order MFB low-pass filter circuit configuration by inserting a positive feedback loop between the op-amp output and the capacitor previously connected to ground in the MFB configuration. The feedback loop enables the integrated circuit to become a fully programmable second order low-pass filter building block that provides a very flexible choice of filter parameters, such as cutoff frequency, DC gain, and Q factor, that can all be selected with appropriate resistor values.

Figure 1:
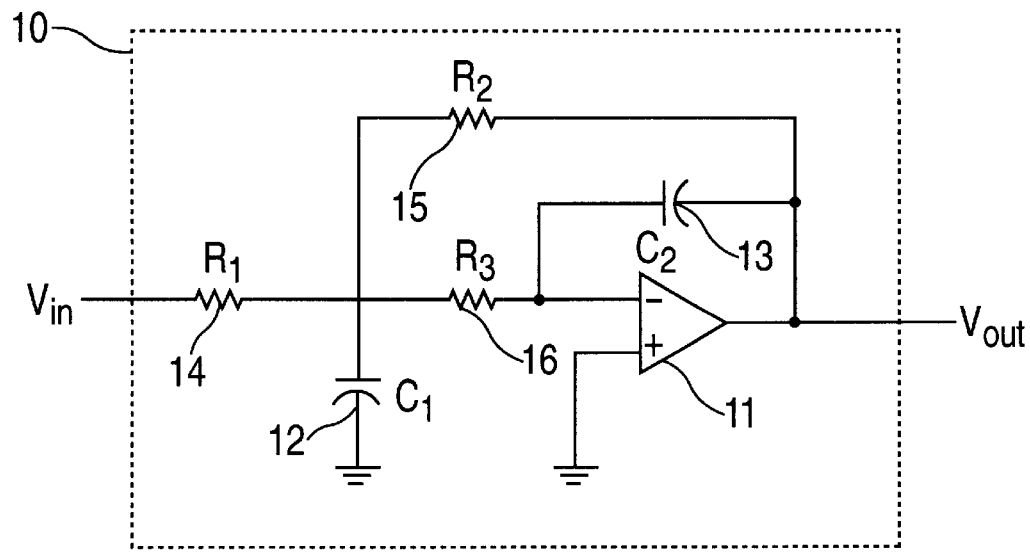
FIG. 1 is a schematic block and circuit diagram of a prior art second order MFB low-pass filter.

Referring to FIG. 1, a schematic block and circuit diagram of a prior art second order MFB low-pass filter is described. Filter circuit 10, which implements a second order low-pass filter, includes op-amp 11, capacitors C1 (12) and C2 (13), and resistors R1 (14), R2 (15), and R3 (16). Circuit 10 also includes an input terminal $V_{in}$ for receiving an electric signal containing a DC component, high frequency AC components, and possibly low frequency AC components, and an output terminal $V_{out}$ connected directly to the output of op-amp 11.

The second order low-pass transfer function of filter circuit 10 is represented by the equation:

$$H(s) = \frac{V_{out}}{V_{in}} = H_0 \frac{w_0^2}{s^2 + s\frac{w_0}{Q} + w_0^2}$$

where:
- s=j.w, where j represents a complex number equal to the square root of negative one and w represents the frequency variable;
- $w_0$=cutoff frequency;
- Q=Q factor of the low-pass filter;
- $H_0$=DC gain of the low-pass filter;

In terms of filter 10 components R1 (14), R2 (15), R3 (16), C1 (12), and C2 (13), the cutoff frequency $w_0$, Q, and the DC gain $H_0$ are represented by the following equations:

$$w_0 = \frac{1}{\sqrt{R_2 R_3 C_1 C_2}}$$

$$Q = \frac{R_1 \sqrt{R_2 R_3}}{R_1 R_2 + R_1 R_3 + R_2 R_3} \sqrt{\frac{C_1}{C_2}}$$

$$H_0 = -\frac{R_2}{R_1}$$

Figure 2:
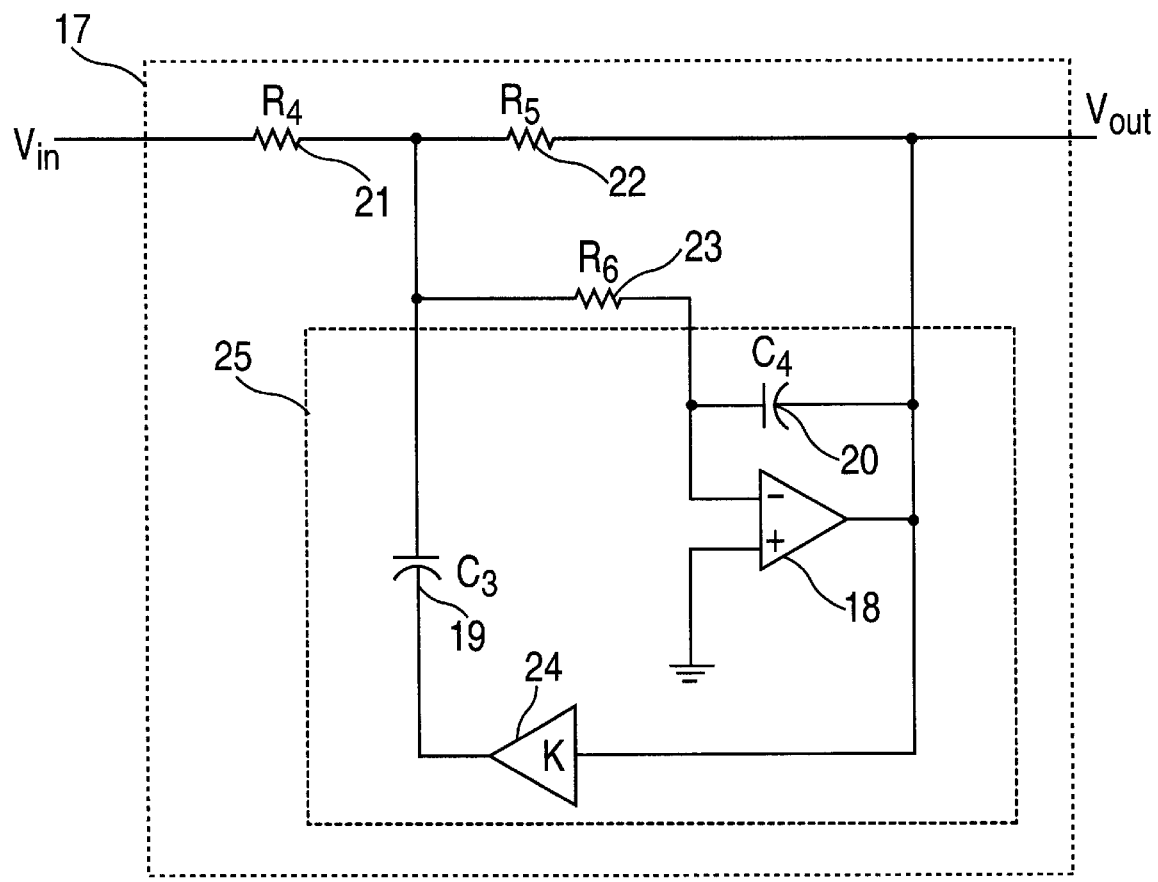
FIG. 2 is a schematic block and circuit diagram of a preferred embodiment of a second order low-pass filter constructed in accordance with the principles of the present invention.

Referring now to FIG. 2, a schematic block and circuit diagram of a preferred embodiment of a second order low-pass filter constructed in accordance with the principles of the present invention is described. Filter circuit 17 includes op-amp 18, capacitors C3 (19) and C4 (20), and resistors R4 (21), R5 (22), and R6 (23). Circuit 17 also includes an input terminal $V_{in}$ for receiving an electric signal containing a DC component, high frequency AC components, and possibly low frequency AC components, and an output terminal $V_{out}$ connected directly to the output of op-amp 18.

In addition, circuit 17 includes feedback amplifier 24 that has a gain K. The actual gain K of feedback amplifier 24 is not critical to the operation of filter circuit 17 as long as the gain is fixed and consistent. In a preferred embodiment, K has a value in the −0.5 to −1.0 range. The signal through feedback amplifier 24 consists of positive feedback between the output of op-amp 18 and capacitor C3 (19), since feedback amplifier 24 has an inverting gain and op-amp 18 is connected in an inverting configuration. Op-amp 18, capacitors C3 (19) and C4 (20), and feedback amplifier 24 form integrated circuit portion 25 of circuit 17.

Without feedback amplifier 24, or conversely, if the feedback gain is set to zero, capacitor C3 (19) and the positive input of op-amp 18 are connected to ground, and circuit 17 becomes equivalent to the second order MFB low-pass filter of FIG. 1. Adding feedback amplifier 24 to circuit 10 of FIG. 1 enables circuit 17 to implement a fully programmable second order low-pass filter with much lower capacitance and capacitance ratio than circuit 10 of FIG. 1, and much smaller active circuitry area (by at least 50%) than other fully-programmable low-pass filter configurations, including the Tow-Thomas and state variable filters. The lower capacitance value results in a lower manufacturing cost as well as in a much smaller die area.

The second order low-pass transfer function of filter circuit 17 is represented by the same standard second order low-pass transfer function as circuit 10. In terms of filter 17 components R4 (21), R5 (22), R6 (23), C3 (19), and C4 (20), the cutoff frequency $w_0$ and the DC gain $H_0$ are represented by equations similar to the equations for the cutoff frequency and DC gain of circuit 10, with the difference that resistors R1 (14), R2 (15), and R3 (16) of circuit 10 are substituted by resistors R4 (21), R5 (22), and R6 (23) of circuit 17, and capacitors C1 (12) and C2 (13) of circuit 10 are substituted by capacitors C3 (19) and C4 (20) of circuit 17. The equations for cutoff frequency $w_0$ and DC gain $H_0$ of circuit 17 are therefore:

$$w_0 = \sqrt{\frac{1}{R_5 R_6 C_3 C_4}}$$

$$H_0 = -\frac{R_5}{R_4}$$

The Q factor of circuit 17, however, is represented by an equation substantially different than the equation for the Q factor of circuit 10 due to the inclusion of feedback amplifier 24. Feedback amplifier 24 has a gain K that enables a given Q factor to be achieved with a lower capacitance ratio and lower overall capacitance in circuit 17 than in circuit 10, thereby significantly reducing the cost and die area of circuit 17 as compared to circuit 10. The equation for the Q factor of circuit 17 is:

$$Q = \frac{R_4 \sqrt{R_5 R_6 C_3 C_4}}{(R_4 R_5 + R_4 R_6 + R_5 R_6)C_4 + K R_4 R_5 C_3}$$

As an example of how circuit 17 significantly improves the capacitance ratio as compared to circuit 10, consider the case in which $R_1=R_2=R_3=R_4=R_5=R_6=R$ and a Q factor of 2 is desired. The capacitance ratio $C_1/C_2$ required for circuit 10 to achieve this Q factor with all resistors being equal to R would be 36. Assuming the gain K of feedback amplifier 24 is equal to −1, circuit 17 would only require a capacitance ratio $C_3/C_4$ of 2.25, which is a factor 16 smaller than the capacitance ratio required in circuit 10 to achieve the same Q factor. The total capacitance in circuit 17 is 2.84 times smaller than the total capacitance in circuit 10, which translates into a much lower cost, die area, and flexibility of selecting the filter parameters for circuit 17 as compared to circuit 10.

Figure 3:
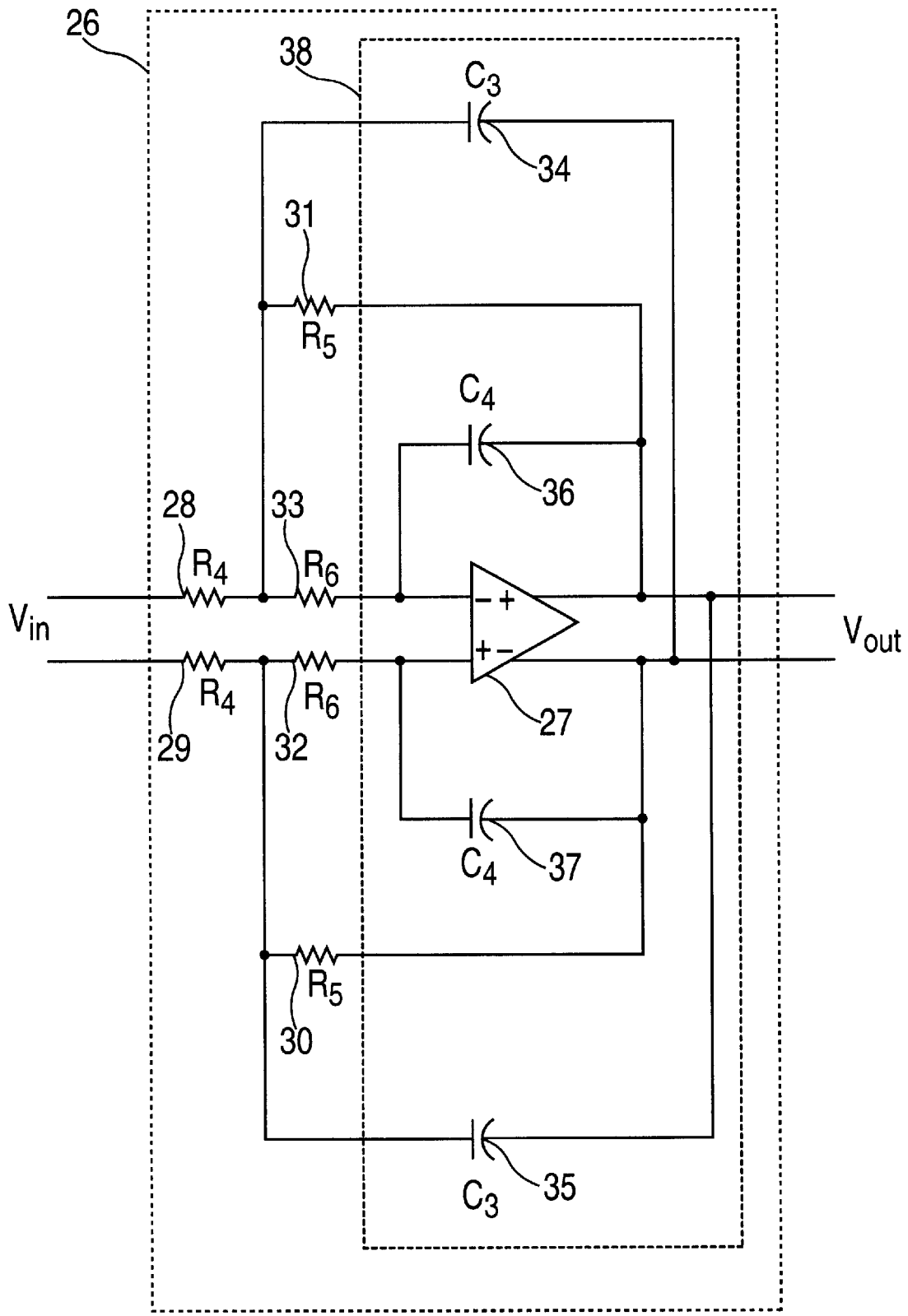
FIG. 3 is a schematic block and circuit diagram of an alternate embodiment of a second order low-pass filter constructed in accordance with the principles of the present invention.

The second order low-pass filter implemented by circuit 17 of FIG. 2 also may be implemented by a differential circuit configuration. Referring now to FIG. 3, a schematic block and circuit diagram of an alternate embodiment of a second order low-pass filter constructed in accordance with the principles of the present invention is described. Differential circuit 26 includes differential amplifier 27, as well as resistors 28 and 29 having resistance R4, resistors 30 and 31 having resistance R5, resistors 32 and 33 having resistance R6, capacitors 34 and 35 having capacitance C3, and capacitors 36 and 37 having capacitance C4. Circuit 26 also includes an input terminal $V_{in}$ for receiving an electric signal containing a DC component, high frequency AC components, and possibly low frequency AC components, and an output terminal $V_{out}$ connected directly to the output of differential amplifier 27. Differential amplifier 27, and capacitors 34, 35, 36, and 37 form integrated portion 38 of circuit 26.

The second order low-pass transfer function of filter circuit 26 is the same as the second order low-pass transfer function of circuit 17. The cutoff frequency $w_0$ and the DC gain $H_0$ of circuit 26 also are represented by the same equations for the cutoff frequency and DC gain of circuit 17. The equation for the Q factor of circuit 26 is:

$$Q = \frac{R_4 \sqrt{R_5 R_6 C_3 C_4}}{(R_4 R_5 + R_4 R_6 + R_5 R_6)C_4 - R_4 R_5 C_3}$$

The Q factor of circuit 26 is therefore the same as the Q factor of circuit 17 when K is equal to −1. Circuit 26 does not require a feedback amplifier as circuit 17, since the feedback loop is realized by the inverted output of differential amplifier 27.

Figure 4:
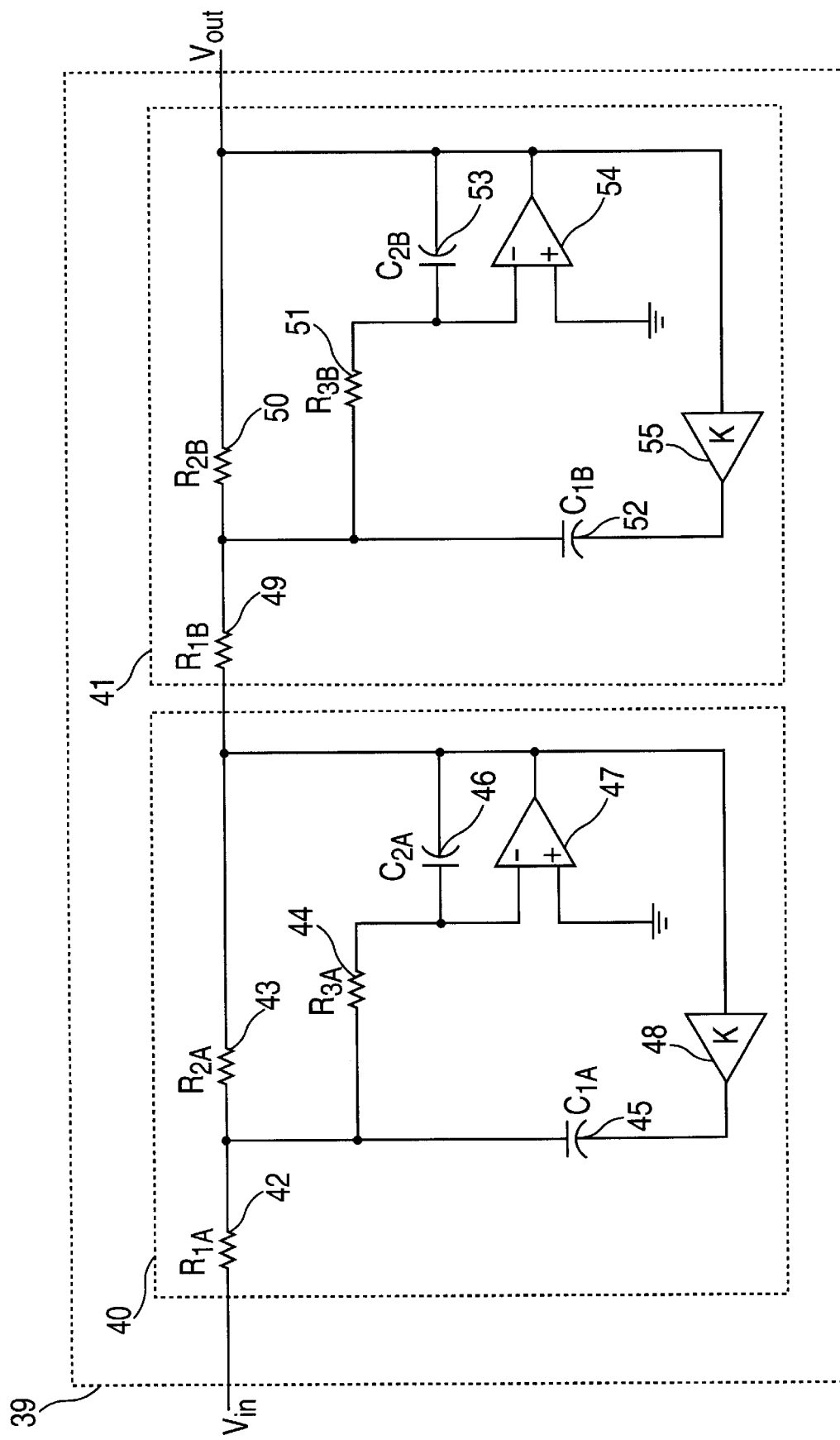
FIG. 4 is a schematic block and circuit diagram of a fourth order low-pass filter constructed by cascading the second order low-pass filter of FIG. 2.

Referring to FIG. 4, a schematic block and circuit diagram of a fourth order low-pass filter constructed by cascading the second order low-pass filter of FIG. 2 is described. Filter circuit 39, which implements a fourth order low-pass filter, consists of cascading second order low-pass filter building blocks 40 and 41. Each of building blocks 40 and 41 is implemented as the second order low-pass filter of FIG. 2. Building block 40 includes resistors R1A (42), R2A (43), and R3A (44), capacitors C1A (45) and C2A (46), op-amp 47, and feedback amplifier 48, while building block 41 includes resistors R1B (49), R2B (50), and R3B (51), capacitors C1B (52) and C2B (53), op-amp 54, and feedback amplifier 55. The filter designer may choose the A capacitors of building block 40 to be the same as the B capacitors of building block 41, respectively, without any loss of flexibility in selecting the filter parameters such as cutoff frequency, DC gain, and Q factor. The filter parameters can be freely tuned by simply selecting different resistor values, making filter circuit 39 a very easy-to-use fourth order low pass filter.

Figure 5:
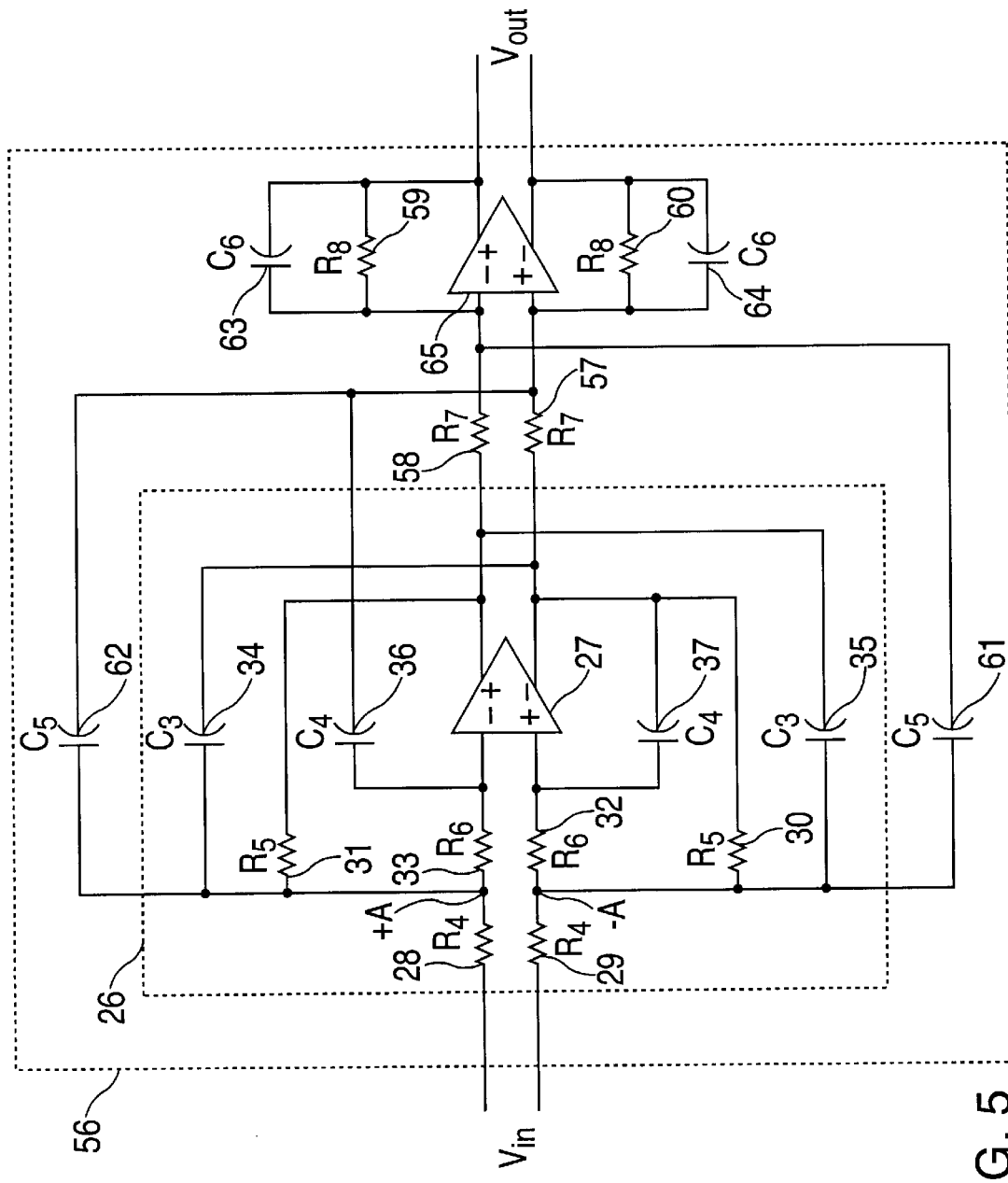
FIG. 5 is a schematic block and circuit diagram of a third order low-pass filter with a stopband notch constructed from the second order low-pass filter of FIG. 3.

Referring now to FIG. 5, a schematic block and circuit diagram of a third order low-pass filter with a stopband notch constructed from the second order low-pass filter of FIG. 3 is described. Filter circuit 56 takes circuit 26 of FIG. 3 and adds to it resistors 57 and 58 having resistance R7, resistors 59 and 60 having resistance R8, capacitors 61 and 62 having capacitance C5, capacitors 63 and 64 having capacitance C6, and differential amplifier 65. These elements are added to filter circuit 26 to realize a single real pole and a complex pole pair with an imaginary zero pair in the stopband, that is, a stopband notch, to form a $3^{rd}$ order low-pass filter. These elements are typically required for elliptic or Cauer transfer function low-pass filters.

The stopband notch is created by using a standard technique that adds together two signals having equal gain and a 180° degree phase difference at the desired notch frequency $w_n$. The two signals cancel each other at the $w_n$ frequency, thus forming a notch in the frequency response at that frequency. The depth of the notch is determined by the gain matching of the two signals.

The stopband notch is realized in circuit 56 by coupling the positive output of differential amplifier 27 to the negative input of differential amplifier 65 through resistor 58 and to node −A through capacitor 61, and by coupling the negative output of differential amplifier 27 to the positive input of differential amplifier 65 through resistor 57 and to node +A through capacitor 62. The voltage at node +A lags the positive output voltage of differential amplifier 27 by 90°, while the voltage at node −A leads the positive output voltage of differential amplifier 27 by 90°. At the input of differential amplifier 65, the currents through resistors 57 and 58, and through capacitors 61 and 62 are summed together.

Since the current in a capacitor leads the voltage across it by 90°, the current in capacitor C5 61 leads the voltage −A by 9°. With the voltage at node −A leading the positive output voltage of differential amplifier 27 by 90°, the current through capacitor 61 leads the current through resistor 57 by 180°. When the amplitudes of the two currents are equal, complete cancellation occurs and the net current flow is zero. The phase difference is constant, but the cancellation only occurs at the notch frequency $w_n$.

The third order transfer function of low-pass filter circuit 56 is represented by the equation:

$$H(s) = H_0 \left[ \frac{w_0^2}{s^2 + s\frac{w_0}{Q} + w_0^2} \right] \left( \frac{s^2 + w_n^2}{w_n^2} \right) \left( \frac{w_p}{s + w_p} \right)$$

where:

$w_0$=cutoff frequency of the second order filter;

$w_n$=notch frequency;

$w_p$=real pole ($3^{rd}$ pole) frequency;

Q=Q factor; and $H_0$=DC gain of the second order filter.

These filter parameters are represented by the following equations:

$$w_0 = \sqrt{\frac{1}{R_5 R_6 C_4 (C_3 + C_5)}}$$

$$w_n = \sqrt{\frac{1}{R_6 R_7 C_4 C_5}}$$

$$w_p = \left( \frac{1}{R_8 C_6} \right)$$

$$H_0 = \left( \frac{R_5}{R_4} \right) \left( \frac{R_8}{R_7} \right)$$

$$Q = \frac{R_4 \sqrt{R_5 R_6 C_4 (C_3 + C_5)}}{(R_4 R_5 + R_4 R_6 + R_5 R_6) C_4 - R_4 R_5 C_3}$$

Although particular embodiments of the present invention have been described above in detail, it will be understood that this description is merely for purposes of illustration. Specific features of the invention are shown in some drawings and not in others, and this is for convenience only and any feature may be combined with another in accordance with the invention. Steps of the described processes may be reordered or combined, and other steps may be included. Further variations will be apparent to one skilled in the art in light of this disclosure and are intended to fall within the scope of the appended claims.

What is claimed is:

1. A low-pass filter circuit having an input for receiving an analog input signal $V_{in}$ and having an output for producing a filtered analog output signal $V_{out}$, wherein the filter circuit has a gain, defined by a ratio of $V_{out}$ to $V_{in}$, having a magnitude and a phase dependent upon frequency w, the filter circuit coupled between the input and the output for providing the magnitude, such that the magnitude as a function of frequency includes a passband to pass low frequencies and a stopband to stop high frequencies, and a cutoff frequency $w_0$ in a transition region therebetween, the filter circuit causing the gain to conform to a second-order frequency-dependent function expressed as:

$$H_0 \frac{w_0^2}{s^2 + s\frac{w_0}{Q} + w_0^2}$$

wherein s=j.w, where j represents a complex number equal to the square root of negative one, $H_0$ represents the DC gain of the filter circuit, and Q represents the Q factor or pole quality factor of the filter circuit, the filter circuit comprising:

a first and second resistors coupled between the input and the output;

an operational amplifier having a negative input, a positive input, and an output;

a third resistor connected between the first resistor and the negative input of the operational amplifier;

a first capacitor connected between the negative input of the operational amplifier and the output of the filter circuit;

a feedback element having an input, an output, and a negative gain forming a positive feedback path to achieve a very flexible choice of filter parameters $w_0$, $H_0$, and Q; and a second capacitor connected between the output of the feedback element and the first resistor.

2. The low-pass filter circuit of claim 1, wherein the first capacitor, the second capacitor, the operational amplifier, and the feedback element are integrated.

3. The low-pass filter circuit of claim 1, wherein the low-pass filter circuit is a monolithic integrated circuit.

4. The low-pass filter circuit of claim 1, wherein the DC gain $H_0$, the cutoff frequency $w_0$, and the Q factor Q conform to the following equations:

$$H_0 = -\frac{R_2}{R_1}$$

$$w_0 = \sqrt{\frac{1}{R_2 R_3 C_1 C_2}}$$

$$Q = \frac{R_1 \sqrt{R_2 R_3 C_1 C_2}}{(R_1 R_2 + R_1 R_3 + R_2 R_3) C_1 + K R_1 R_2 C_2}$$

wherein R1 and R2 and R3 are resistor values of the first, second, and third resistors, C1 and C2 are capacitor values of the first and second capacitors, and K is the gain of the feedback element.

5. The low-pass filter circuit of claim 1, wherein the low-pass filter may be cascaded in series to form higher order filters, wherein the higher order is equal to $2^n$ and n is the number of cascaded low-pass filter circuits.

6. A low-pass filter circuit having an input for receiving an analog input signal $V_{in}$ and having an output for producing a filtered analog output signal $V_{out}$, wherein the filter circuit has a gain, defined by a ratio of $V_{out}$ to $V_{in}$, having a magnitude and a phase dependent upon frequency w, the filter circuit coupled between the input and the output for providing the magnitude, such that the magnitude as a function of frequency includes a passband to pass low frequencies and a stopband to stop high frequencies, and a cutoff frequency $w_0$ in a transition region therebetween, the filter circuit causing the gain to conform to a second-order frequency-dependent function expressed as:

$$H_0 \frac{w_0^2}{s^2 + s\frac{w_0}{Q} + w_0^2}$$

wherein s=j.w, where j represents a complex number equal to the square root of negative one, $H_0$ represents the DC gain of the filter circuit, and Q represents the Q factor or pole quality factor of the filter circuit, the filter circuit comprising:

a differential amplifier having a negative and a positive input, and a negative and a positive output;

a first and second resistors connected between the input of the low-pass filter circuit and the negative input of the differential amplifier;

a third and fourth resistors connected between the input of the low-pass filter circuit and the positive input of the differential amplifier;

a fifth resistor connected between the first resistor and the positive output of the differential amplifier;

a sixth resistor connected between the third resistor and the negative output of the differential amplifier;

a first capacitor connected between the negative input of the differential amplifier and the positive output of the differential amplifier;

a second capacitor connected between the positive input of the differential amplifier and the negative output of the differential amplifier;

a third capacitor connected between the first resistor and the negative output of the differential amplifier; and a fourth capacitor connected between the third resistor and the positive output of the differential amplifier.

7. The low-pass filter circuit of claim 6, wherein the differential amplifier, the first capacitor, the second capacitor, the third capacitor, and the fourth capacitor are integrated.

8. The low-pass filter circuit of claim 6, wherein the low-pass filter circuit is a monolithic integrated circuit.

9. The low-pass filter circuit of claim 6, wherein the first and third resistors have the same resistance, the second and fourth resistors have the same resistance, and the fifth and sixth resistors have the same resistance.

10. The low-pass filter circuit of claim 6, wherein the first capacitor and the second capacitor have the same capacitance, and the third capacitor and the fourth capacitor have the same capacitance.

11. The low-pass filter circuit of claim 6, wherein the DC gain $H_0$, the cutoff frequency $w_0$, and the Q factor Q conform to the following equations:

$$H_0 = -\frac{R_2}{R_1}$$

$$w_0 = \sqrt{\frac{1}{R_2 R_3 C_1 C_2}}$$

$$Q = \frac{R_1 \sqrt{R_2 R_3 C_1 C_2}}{(R_1 R_2 + R_1 R_3 + R_2 R_3)C_1 - R_1 R_2 C_2}$$

where R1 is the resistance of the first and third resistors, R2 is the resistance of the fifth and sixth resistors, R3 is the resistance of the second and fourth resistors, C1 is the capacitance of the first and second capacitors, and C2 is the capacitance of the third and fourth capacitors.

12. The low-pass filter of claim 6, wherein the low-pass filter circuit may be cascaded in series to form higher order filters.

13. The low-pass filter of claim 6, wherein the low-pass filter is combined with a second circuit, the second circuit comprising:

a differential amplifier having a negative and a positive input, and a negative and a positive output;

a first resistor connected between the negative input of the differential amplifier and the positive output of the differential amplifier of the low-pass filter;

a second resistor connected between the positive input of the differential amplifier and the negative output of the differential amplifier of the low-pass filter;

a third resistor connected between the negative input and the positive output of the differential amplifier;

a fourth resistor connected between the positive input and the negative output of the differential amplifier;

a first capacitor connected between the negative input and the positive output of the differential amplifier;

a second capacitor connected between the positive input and the negative output of the differential amplifier;

a third capacitor connected between the negative input of the differential amplifier and the first resistor of the low-pass filter; and a fourth capacitor connected between the positive input of the differential amplifier and the third resistor of the low-pass filter.

14. The low-pass filter circuit of claim 13, wherein the low-pass filter circuit and the second circuit form a third-order low-pass filter circuit with a stopband notch.

15. The low-pass filter circuit of claim 14, wherein the third-order low-pass filter circuit is a monolithic integrated circuit.

* * * * *

UNITED STATES PATENT AND TRADEMARK OFFICE
CERTIFICATE OF CORRECTION

PATENT NO. : 6,344,773 B1  Page 1 of 1
DATED : February 5, 2002
INVENTOR(S) : Sevastopoulos et al.

It is certified that error appears in the above-identified patent and that said Letters Patent is hereby corrected as shown below:

Title page,
Item [56] OTHER PUBLICATIONS, change "Halt" to -- Holt --.

Column 2,
Line 11, change "$2^{nd}$ nd" to -- 2nd --.

Signed and Sealed this

Twenty-first Day of May, 2002

Attest:

JAMES E. ROGAN
Attesting Officer    Director of the United States Patent and Trademark Office